United States Patent
Jen et al.

(10) Patent No.: US 9,788,416 B2
(45) Date of Patent: Oct. 10, 2017

(54) MULTILAYER SUBSTRATE FOR SEMICONDUCTOR PACKAGING

(71) Applicant: INTEL CORPORATION, Santa Clara, CA (US)

(72) Inventors: Wei-Lun Kane Jen, Chandler, AZ (US); Padam Jain, Davis, CA (US); Dilan Seneviratne, Chandler, AZ (US); Chi-Mon Chen, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/778,987

(22) PCT Filed: Dec. 22, 2014

(86) PCT No.: PCT/US2014/071994
§ 371 (c)(1),
(2) Date: Sep. 21, 2015

(87) PCT Pub. No.: WO2016/105349
PCT Pub. Date: Jun. 30, 2016

(65) Prior Publication Data
US 2016/0329274 A1    Nov. 10, 2016

(51) Int. Cl.
*H01L 23/13* (2006.01)
*H05K 1/02* (2006.01)
(Continued)

(52) U.S. Cl.
CPC ..... *H05K 1/0271* (2013.01); *H01L 21/02002* (2013.01); *H01L 21/02008* (2013.01);
(Continued)

(58) Field of Classification Search
CPC ......... H01L 21/02002; H01L 21/02008; H01L 21/0201; H01L 21/02016; H01L 21/02032;
(Continued)

(56) References Cited

U.S. PATENT DOCUMENTS 6,177,728 B1   1/2001 Susko et al.
2002/0048844 A1*   4/2002 Sakaguchi .......... H01L 21/6835
                                               438/106
(Continued)

FOREIGN PATENT DOCUMENTS

JP    2008027992 A    2/2008
JP    2010122304 A    6/2010
WO    2011046809 A2   4/2011

OTHER PUBLICATIONS

International Search Report and Written Opinion mailed Sep. 30, 2015 for International Application No. PCT/US2014/071994, 10 pages.
(Continued)

*Primary Examiner* — Eduardo A Rodela
(74) *Attorney, Agent, or Firm* — Schwabe, Williamson & Wyatt, P.C.

(57) ABSTRACT

Embodiments disclosed include a multilayer substrate for semiconductor packaging. The substrate may include a first layer with a first side with an xy-plane and individual locations on the first side have a first side distance below the first side xy-plane, and a second side with a second side xy-plane and individual locations on the second side may have a second side distance below the second side xy-plane; and a second layer with a first side coupled to the second side of the first layer and a second side opposite the first side of the second layer, wherein a thickness of the second layer at the individual locations on the second layer may be com-
(Continued)

prised of the first side distance plus the second side distance. Other embodiments may be described and/or claimed.

23 Claims, 6 Drawing Sheets

(51) Int. Cl.
  *H01L 21/02* (2006.01)
  *H01L 23/12* (2006.01)
  *H01L 21/48* (2006.01)
  *H01L 21/683* (2006.01)
  *H01L 23/31* (2006.01)
  *H01L 23/498* (2006.01)
  *H01L 23/00* (2006.01)
  *H05K 1/18* (2006.01)
  *H01L 25/065* (2006.01)
  *H05K 1/03* (2006.01)

(52) U.S. Cl.
  CPC .... *H01L 21/02035* (2013.01); *H01L 21/4857* (2013.01); *H01L 21/6835* (2013.01); *H01L 23/12* (2013.01); *H01L 23/13* (2013.01); *H01L 23/3185* (2013.01); *H01L 23/49822* (2013.01); *H01L 23/49838* (2013.01); *H01L 23/49894* (2013.01); *H01L 24/16* (2013.01); *H01L 25/0657* (2013.01); *H01L 2221/68345* (2013.01); *H01L 2224/16225* (2013.01); *H01L 2224/16227* (2013.01); *H01L 2224/32225* (2013.01); *H01L 2224/73204* (2013.01); *H01L 2924/0002* (2013.01); *H01L 2924/15311* (2013.01); *H05K 1/0298* (2013.01); *H05K 1/0393* (2013.01); *H05K 1/181* (2013.01); *H05K 2201/0191* (2013.01); *H05K 2201/05* (2013.01)

(58) Field of Classification Search
  CPC ... H01L 21/02035; H01L 23/12; H01L 23/13; H01L 23/14; H01L 23/145; H01L 23/147
  See application file for complete search history.

(56) References Cited

U.S. PATENT DOCUMENTS

| | | | |
|---|---|---|---|
| 2002/0137313 A1* | 9/2002 | Ueno | B24B 37/042 438/493 |
| 2004/0065473 A1 | 4/2004 | Chang et al. | |
| 2011/0024899 A1 | 2/2011 | Masumoto et al. | |
| 2014/0252632 A1* | 9/2014 | Barth | H01L 23/5384 257/773 |
| 2015/0171024 A1* | 6/2015 | Choi | H01L 24/97 257/774 |
| 2015/0206812 A1* | 7/2015 | Kim | H01L 21/4846 257/622 |

OTHER PUBLICATIONS

Office Action mailed Dec. 14, 2016 for Korean Application No. 2015-7033254, 6 pages.

* cited by examiner

MULTILAYER SUBSTRATE FOR SEMICONDUCTOR PACKAGING

CROSS-REFERENCE TO RELATED APPLICATION

The present application is a national phase entry under 35 U.S.C. §371 of International Application No. PCT/US2014/071994, filed Dec. 22, 2014, entitled "MULTILAYER SUBSTRATE FOR SEMICONDUCTOR PACKAGING," which designates the United States of America, the entire disclosure of which is hereby incorporated by reference in its entirety and all purposes.

FIELD

Embodiments of the present disclosure generally relate to the field of packaging for semiconductor devices, and more particularly, to a multilayer substrate for semiconductor packaging.

BACKGROUND

Semiconductor substrate thickness variation within a single substrate can present problems when a die is attached in a flip chip configuration to the substrate. Too much variation of thickness can result in not all interconnects being coupled to the substrate, resulting in reduced overall product yield. Thickness variation may present even greater challenges when a die is a larger size die such as a server processor die since there is a larger area of the substrate where the die will be attached. The larger area means that the substrate needs a larger area of thickness uniformity in order to have all interconnects couple to the substrate. Thickness variation of a substrate may be decreased by reducing individual thickness variation of dielectric layers and metal routing layers in the substrate. However, package electrical performance requirements, such as I/O routing, power, and impedance, may constrain this approach to reducing substrate thickness variation. For example, a power delivery layer design may have a higher copper density in the design to minimize DC resistance, thereby presenting a challenge of balancing power delivery with substrate thickness variation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
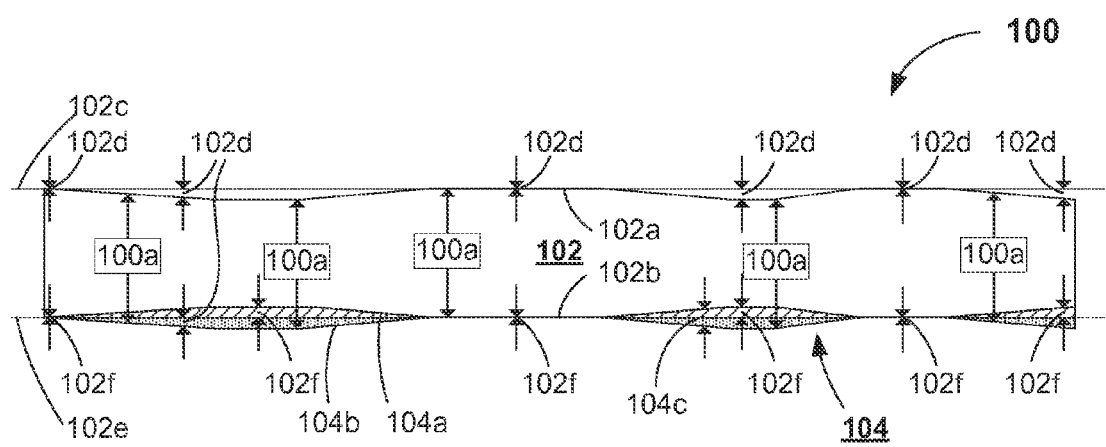
FIG. 1 schematically illustrates a cross-section side view of an example multilayer substrate for semiconductor packaging, in accordance with some embodiments.

Embodiments of the present disclosure describe a stacked semiconductor device package and associated techniques and configurations. In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example multilayer substrate for semiconductor packaging (substrate) 100, in accordance with some embodiments. In some embodiments, substrate 100 may include a first layer 102 with a first side 102a and a second side 102b opposite the first side 102a, wherein the first side 102a may have a first side xy-plane 102c defined by three highest points on the first side 102a, and individual locations on the first side may have a first side distance 102d below the first side xy-plane 102c in a direction towards the second side 102b, wherein the second side 102b may have a second side xy-plane 102e defined by three highest points on the second side 102b, and individual locations on the second side 102b may have a second side distance 102f below the second side xy-plane 102e in a direction towards the first side 102a; and a second layer 104 with a first side 104a coupled to the second side 102b of the first layer 102 and a second side 104b opposite the first side 104a of the second layer 104, wherein a thickness 104c of the second layer 104 at the individual locations on the second layer 104 may be comprised of the first side distance 102d plus the second side distance 102f, wherein a thickness of the first layer 102 plus the thickness of the second layer 104 at individual locations between the first side 102a of the first layer 102 and the second side 104b of the second layer 104 may be a substantially uniform thickness 100a. For illustration purposes only, the first side xy-plane 102c and the second side xy-plane 102e are shown in FIG. 1 as defined by three high points on sides 102a and 102b, respectively, in the cross-section of the substrate 100 of FIG. 1. Individual locations on the first side 102a correspond to points in the xy-plane 102c of the first side 102a, separated by a z-direction distance from the xy-plane 102c to the first side surface 102a. Similarly, individual locations on the second side 102b correspond to points in the xy-plane 102e of the second side 102b, separated by a z-direction distance from the xy-plane 102e to the second side surface 102b. The distance between individual locations on the first side 102a and the second side 102b is the z-direction thickness of the first layer 102 at an individual location.

In some embodiments, the three highest points on the first side 102a may be spaced apart at different individual locations not in the same cross-section of the substrate 100. Similarly, in some embodiments, the three highest points on the second side 102b may be spaced apart at different individual locations not in the same cross-section of the substrate 100. In some embodiments, the individual locations of the three highest points on first side 102a do not correspond to the individual locations of the three highest points on the second side 102b. In some embodiments, the individual location of a least one of the three highest points on the first side 102a may correspond to the individual location of at least one of the three highest points on the second side 102b.

In some embodiments, the first side distance 102d may be zero at the individual locations of the three highest points on the first side 102a. In some embodiments, the first side distance 102d may be greater than zero at the individual locations not including the three highest points on the first side 102a. In some embodiments, the second side distance 102f may be zero at the individual locations of the three highest points on the second side 102b. In some embodiments, the second side distance 102f may be greater than zero at the individual locations not including the three highest points on the second side 102b.

In some embodiments, the first layer 102 may be a multilayer composite substrate with a core. In some embodiments, the first layer 102 may be a multilayer composite substrate without a core. In some embodiments, the first layer 102 may be a multilayer composite substrate with a thin core. In some embodiments, the first layer 102 may be a multilayer composite with four or more layers, eight or more layers, sixteen or more layers, or thirty or more layers.

In some embodiments, the second layer 104 may be comprised of one or more layers of one or more dielectric materials. In some embodiments, the dielectric materials may include a polymer or a polymer composite. In some embodiments, dielectric materials may be one or more materials selected from the group consisting of Ajinomoto Build-up Film (ABF), fire retardant 2 material (FR2), fire retardant 4 material (FR4), polyimide, passivation film (WPR), poly benzthiazole (PBZT), poly benzoxazole (PBO), and mold compound, and combinations thereof.

In some embodiments, uniform thickness 100a may be a uniformity that allows all interconnects of a die being attached in a flip chip configuration to connect to pads on the first side 102a of substrate 100 during an attachment procedure of the die to substrate 100, within reasonable engineering tolerances.

Figure 2:
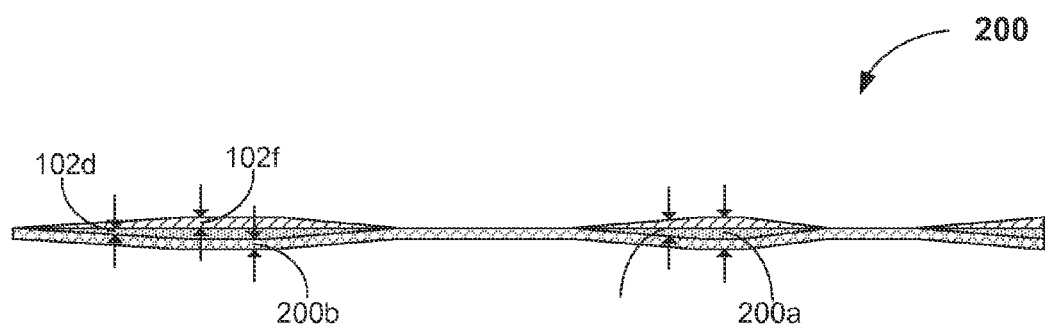
FIG. 2 schematically illustrates a cross-section side view of an example dielectric layer of a multilayer substrate for semiconductor packaging, in accordance with some embodiments.

FIG. 2 schematically illustrates a cross-section side view of an example dielectric layer of a multilayer substrate for semiconductor packaging (second layer 200), in accordance with some embodiments. The embodiment of FIG. 2 may comport with embodiments of substrate 100 of FIG. 1 with the addition of an offset distance 200b. In some embodiments, the thickness 200a of the second layer 200 at the individual locations may be comprised of the first side distance 102d plus the second side distance 102f plus an offset distance 200b, wherein the offset distance 200b may be less than approximately two times the sum of the first side distance 102d and the second side distance 102f. In some embodiments, the offset distance 200b may be less than approximately four times the sum of the first side distance 102d and the second side distance 102f. In some embodiments, the offset distance 200b may be less than approximately ten times the sum of the first side distance 102d and the second side distance 102f. In some embodiments, the offset distance 200b may be equal to the sum of the thickness of the carrier layer of an ABF. In some embodiments, the offset distance 200b may be equal to the sum of two times the thickness of the carrier layer of an ABF. In some embodiments, the offset distance 200b may be equal to the sum of three times the thickness of the carrier layer of an ABF. In some embodiments, the offset distance 200b may be less than ten times the thickness of the carrier layer of an ABF.

Figure 3:
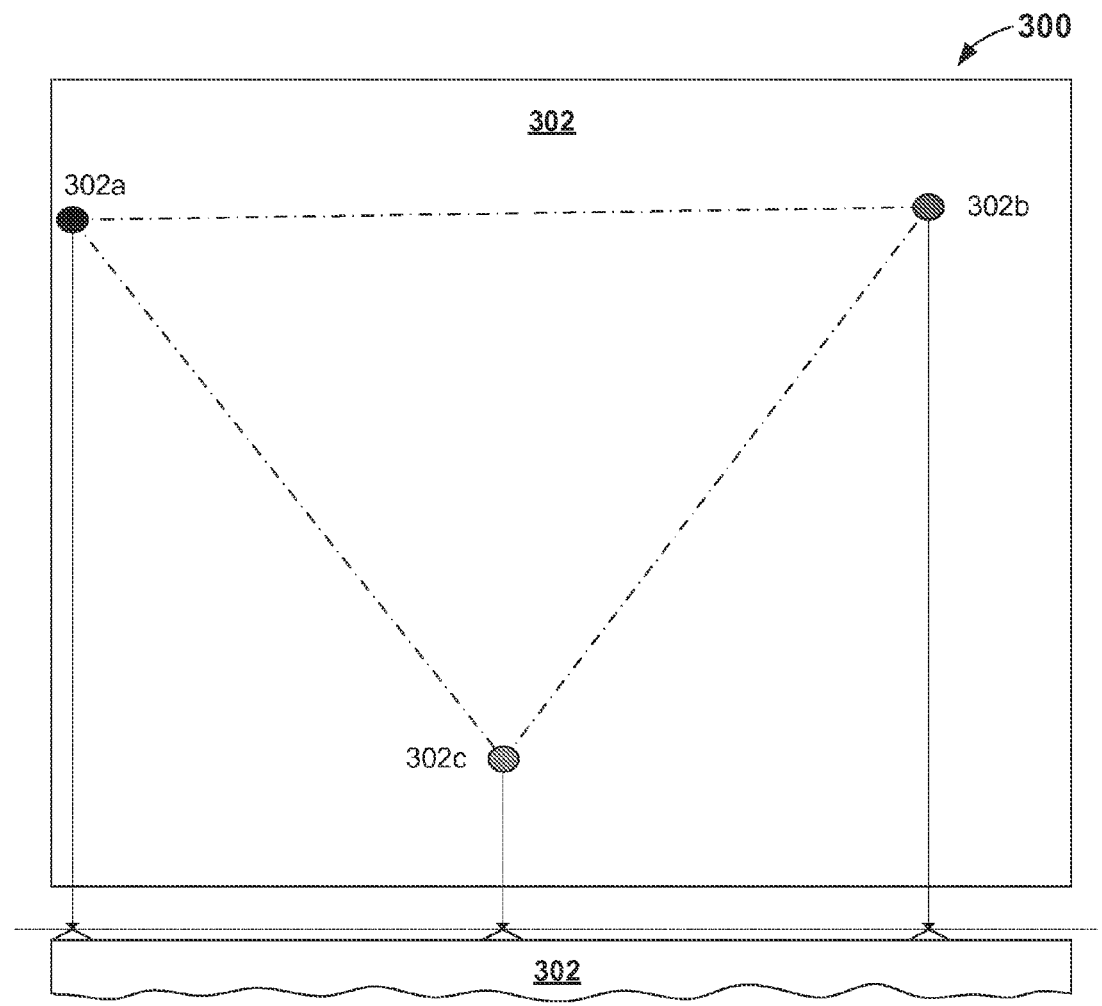
FIG. 3 schematically illustrates a top or bottom view of an example substrate layer of a multilayer substrate for semiconductor packaging, in accordance with some embodiments.

FIG. 3 schematically illustrates a top or bottom view 302 of an example substrate layer of a multilayer substrate for semiconductor packaging 300, in accordance with some embodiments. The embodiment of FIG. 3 may comport with embodiments of substrate 100 of FIG. 1 and second layer 200 of FIG. 2, while showing a top or bottom view 302 of an example substrate. The top or bottom view 302 of a substrate 300 of FIG. 3 may correspond to the first side 102a or the second side 102b of FIG. 1. In some embodiments, the three highest points 302a, 302b, 302c on the first side 102a may be spaced apart at different individual locations not in the same cross-section of the substrate 100, 300. Similarly, in some embodiments, the three highest points 302a, 302b, 302c on the second side 102b may be spaced apart at different individual locations not in the same cross-section of the substrate 100, 300. In some embodiments, the individual locations of the three highest points 302a, 302b, 302c on first side 102a do not correspond to the individual locations of the three highest points 302a, 302b, 302c on the second side 102b, where 302a of the first side 102a does not correspond to 302a of the second side 102b, 302b of the first side 102a does not correspond to 302b of the second side 102b, and where 302c of the first side 102c does not correspond to 302c of the second side 102b. In some embodiments, the individual location of a least one of the three highest points 302a, 302b, 302c on the first side 102a may correspond to the individual location of at least one of the three highest points 302a, 302b, 302c on the second side 102b. For illustration purposes only, a planar view of 302 is shown in FIG. 3 where the three highest points 302a, 302b, 302c are shown as the highest points in the planar view and all other individual locations are shown in a single plane below the three highest points 302a, 302b, 302c.

Figure 4:
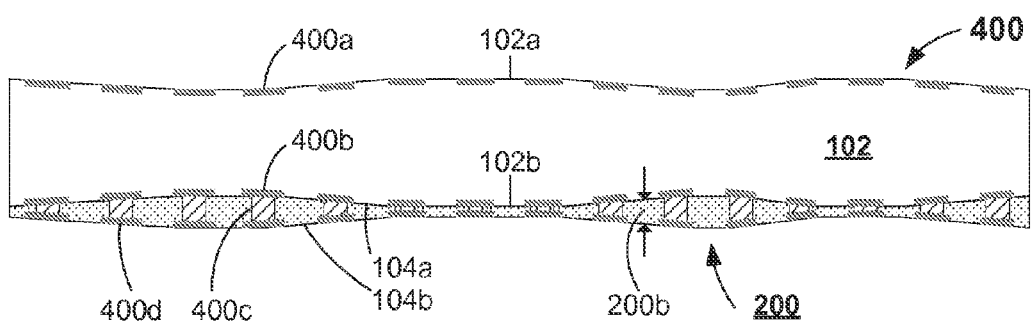
FIG. 4 schematically illustrates a cross-section side view of an example multilayer substrate for semiconductor packaging with selected electrical routing features illustrated, in accordance with some embodiments.

FIG. 4 schematically illustrates a cross-section side view of an example multilayer substrate for semiconductor packaging with selected electrical routing features illustrated 400, in accordance with some embodiments. The embodiment of FIG. 4 may comport with embodiments of the substrate 100 of FIG. 1, the second layer 200 of FIG. 2, and the substrate 300 of FIG. 3, while showing selected electrical routing features. In some embodiments, the first layer 102 has electrical routing features 400a, 400b (connections between 400a and 400b are not illustrated) to route electrical signals between the first side 102a of the first layer 102 and the second side 102b of the first layer 102, wherein the second layer 200 has electrical routing vias 400c electrically coupled to the electrical routing features of the second side 102b of the first layer 102 and passing through the second layer 200 from the first side 104a of the second layer 200 to the second side 104b of the second layer 200 connecting to a second side 104b feature 400d, wherein the electrical routing vias 400c have a depth corresponding to the thickness 200a of the second layer 200.

Figure 5:
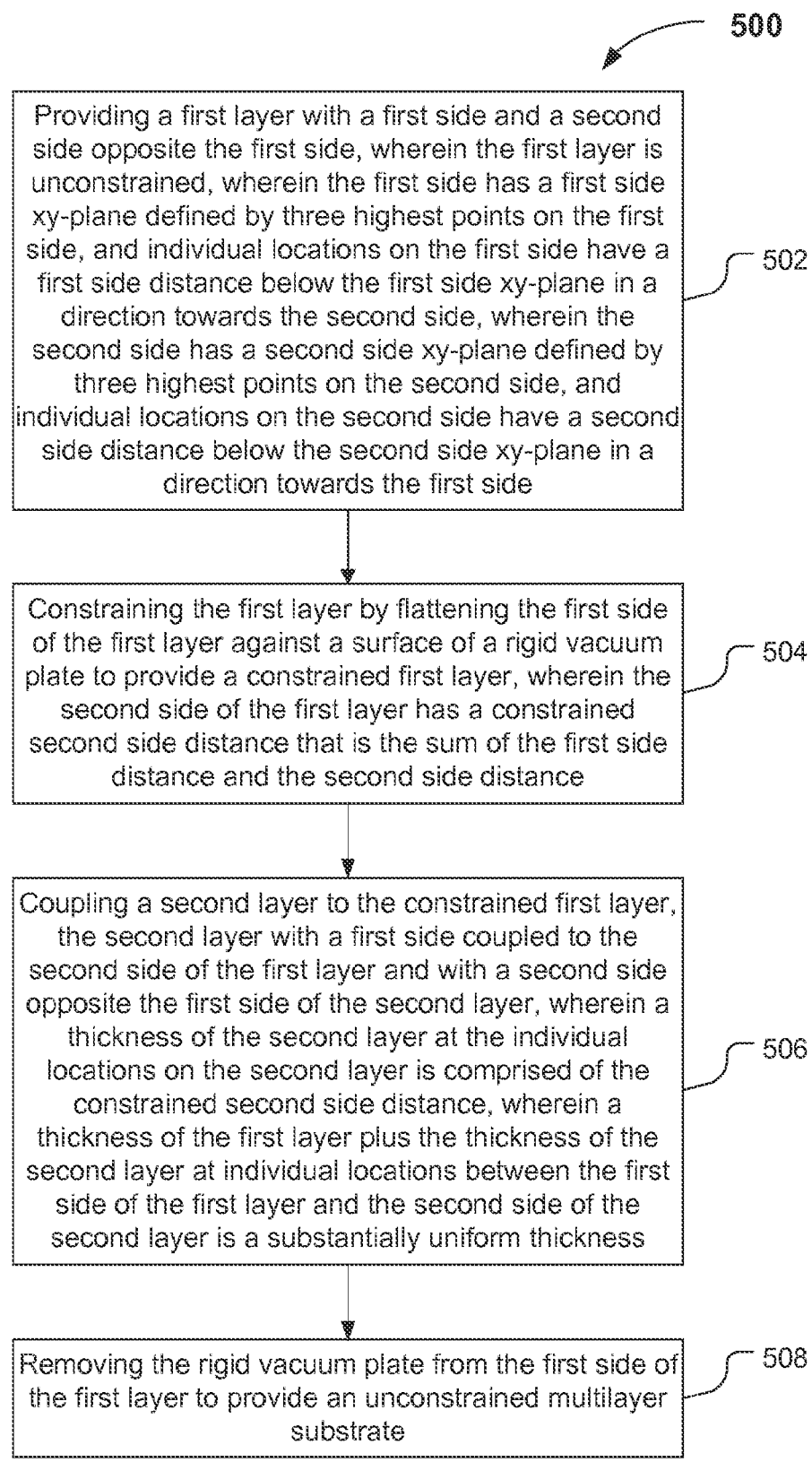
FIG. 5 schematically illustrates a method of making a multilayer substrate for semiconductor packaging, in accordance with some embodiments.

FIG. 5 schematically illustrates a method of making a multilayer substrate for semiconductor packaging 500, in accordance with some embodiments. The embodiment of FIG. 5 may comport with embodiments of the substrate 100 of FIG. 1, the second layer 200 of FIG. 2, the substrate 300 of FIG. 3, and the substrate 400 of FIG. 4, with the addition of a method making a multilayer substrate.

At 502, a first layer may be provided with a first side and a second side opposite the first side, wherein the first layer is unconstrained, wherein the first side may have a first side xy-plane defined by three highest points on the first side, and individual locations on the first side may have a first side distance below the first side xy-plane in a direction towards the second side, wherein the second side may have a second side xy-plane defined by three highest points on the second side, and individual locations on the second side may have a second side distance below the second side xy-plane in a direction towards the first side.

At 504, the first layer may be constrained by flattening the first side of the first layer against a surface of a rigid vacuum plate to provide a constrained first layer, wherein the second side of the first layer may have a constrained second side distance that is the sum of the first side distance and the second side distance.

At 506, a second layer may be coupled to the constrained first layer, the second layer with a first side coupled to the second side of the first layer and with a second side opposite the first side of the second layer, wherein a thickness of the second layer at the individual locations on the second layer may be comprised of the constrained second side distance, wherein a thickness of the first layer plus the thickness of the second layer at individual locations between the first side of the first layer and the second side of the second layer may be a substantially uniform thickness. At 506, the coupling of the second layer to the first layer may further comprise laminating, coating, or casting one or more layers of one or more dielectric materials. At 506, the coupling of the second layer to the first layer may further comprise laminating, wherein the laminating further comprises sequentially attaching, conformally pressing, and plate pressing three layers of ABF.

At 508, the rigid vacuum plate may be removed from the first side of the first layer to provide an unconstrained multilayer substrate.

Figure 6:
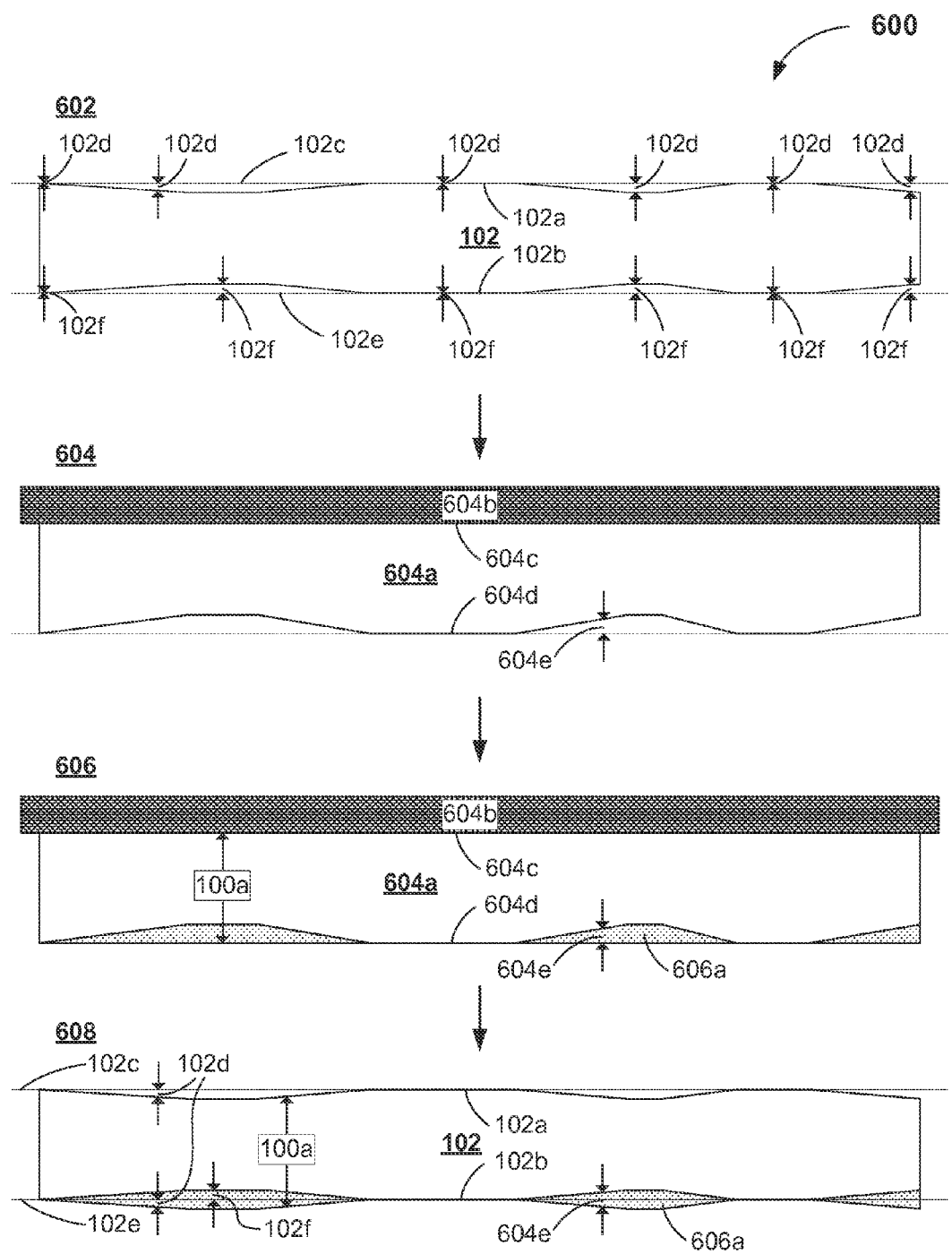
FIG. 6 schematically illustrates a multilayer substrate for semiconductor packaging during various stages of fabrication, in accordance with some embodiments.

FIG. 6 schematically illustrates a multilayer substrate for semiconductor packaging during various stages of fabrication 600, in accordance with some embodiments. The embodiment of FIG. 6 may comport with embodiments of the substrate 100 of FIG. 1, the second layer 200 of FIG. 2, the substrate 300 of FIG. 3, the substrate 400 of FIG. 4, and the method 500 of FIG. 5, with the addition of multilayer substrates during various stages of fabrication.

Structure 602 corresponds to 502 of method 500. Structure 602 illustrates a first layer 102 of a multilayer substrate as shown and described herein. In some embodiments, first layer 102 may have a first side 102a and a second side 102b opposite the first side 102a, wherein the first side 102a may have a first side xy-plane 102c defined by three highest points on the first side 102a, and individual locations on the first side may have a first side distance 102d below the first side xy-plane 102c in a direction towards the second side 102b, wherein the second side 102b may have a second side xy-plane 102e defined by three highest points on the second side 102b, and individual locations on the second side 102b may have a second side distance 102f below the second side xy-plane 102e in a direction towards the first side 102a.

Structure 604 corresponds to 504 of method 500. Structure 604 illustrates a first layer 102 that is constrained by a rigid flat vacuum plate 604b to provide a constrained first layer 604a. In some embodiments, the constrained first layer may have first side 604c coupled to the rigid flat vacuum plate 604b and a second side 604d opposite the first side 604c. In some embodiments, the first side distance 102d may translate to the second side 604d and provide a constrained second side distance 604e that is the sum of the first side distance 102d and the second side distance 102f.

Structure 606 corresponds to 506 of method 500. Structure 606 illustrates the constrained first layer 604a with a second layer 606a coupled to the second side 604d. In some embodiments, the thickness of the constrained first layer 604a plus the thickness of the second layer 606a at individual locations is a substantially uniform thickness 100a.

Structure 608 corresponds to 508 of method 500. Structure 608 illustrates the first layer 102 (unconstrained) with the addition of the second layer 606a.

Various operations of FIGS. 5-6 are described as multiple discrete operations in turn, in a manner that is most helpful in understanding the claimed subject matter. However, the order of description should not be construed as to imply that these operations are necessarily order dependent.

Figure 7:
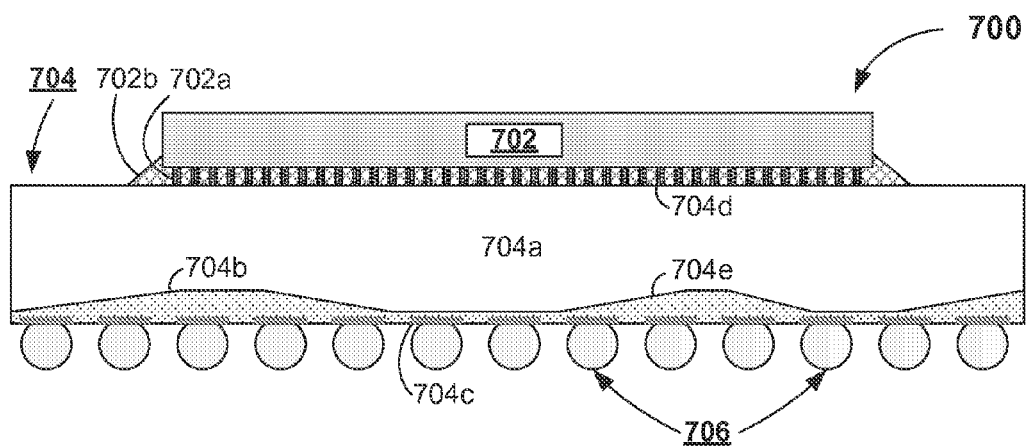
FIG. 7 schematically illustrates a cross-section side view of a multilayer substrate for semiconductor packaging with a die attached to the substrate and selected electrical routing features illustrated, in accordance with some embodiments.

FIG. 7 schematically illustrates a cross-section side view of a multilayer substrate for semiconductor packaging with a die attached to the substrate and selected electrical routing features illustrated (package) 700, in accordance with some embodiments. The embodiment of FIG. 7 may comport with embodiments of the substrate 100 of FIG. 1, the second layer 200 of FIG. 2, the substrate 300 of FIG. 3, the substrate 400 of FIG. 4, the method 500 of FIG. 5, and the substrate of FIG. 6, with the addition of a die attached to the substrate.

In some embodiments, package 700 may be comprised of a multilayer substrate 704 with a first layer 704a and a second layer 704b coupled to the first layer 704a. In some embodiments, the first layer 704a may have a die 702 attached in a flip chip configuration to the first layer 704a. In some embodiments, interconnects 702a may couple the die 702 to the first layer 704a. In some embodiments, an underfill material may further couple the die 702 to the first layer 704a and may protect interconnects 702a. In some embodiments, electrical routing features (not shown) may route electrical signals between the die 702 through the first layer 704a and second layer 704b to pads 704c on the second layer 704b. In some embodiments, interconnects 706, such as solder balls, may be coupled to pads 704c for attachment to a board, such as a printed circuit board. The first layer 704a corresponds to the first layer 102 of the embodiment illustrated in FIG. 1, except that the first layer 704a is constrained by die 702 coupled to the first layer 704a. Therefore, the first layer 704a is illustrated with a flat first side 704d in contrast to first side 102a of first layer 102 in an unconstrained condition. Second side 704e is illustrated to be not flat because first layer 704a is constrained by the die 702 coupled thereto. Second layer 704b is illustrated to be coupled to the first layer 704a and to follow the contour of the second side 704e of the first layer 704a. The opposite side of second layer 704b with interconnects 706 is illustrated to be flat since the die 702 constrains substrate 704. In some embodiments, die 702 may have an underfill material 702b.

Figure 8:
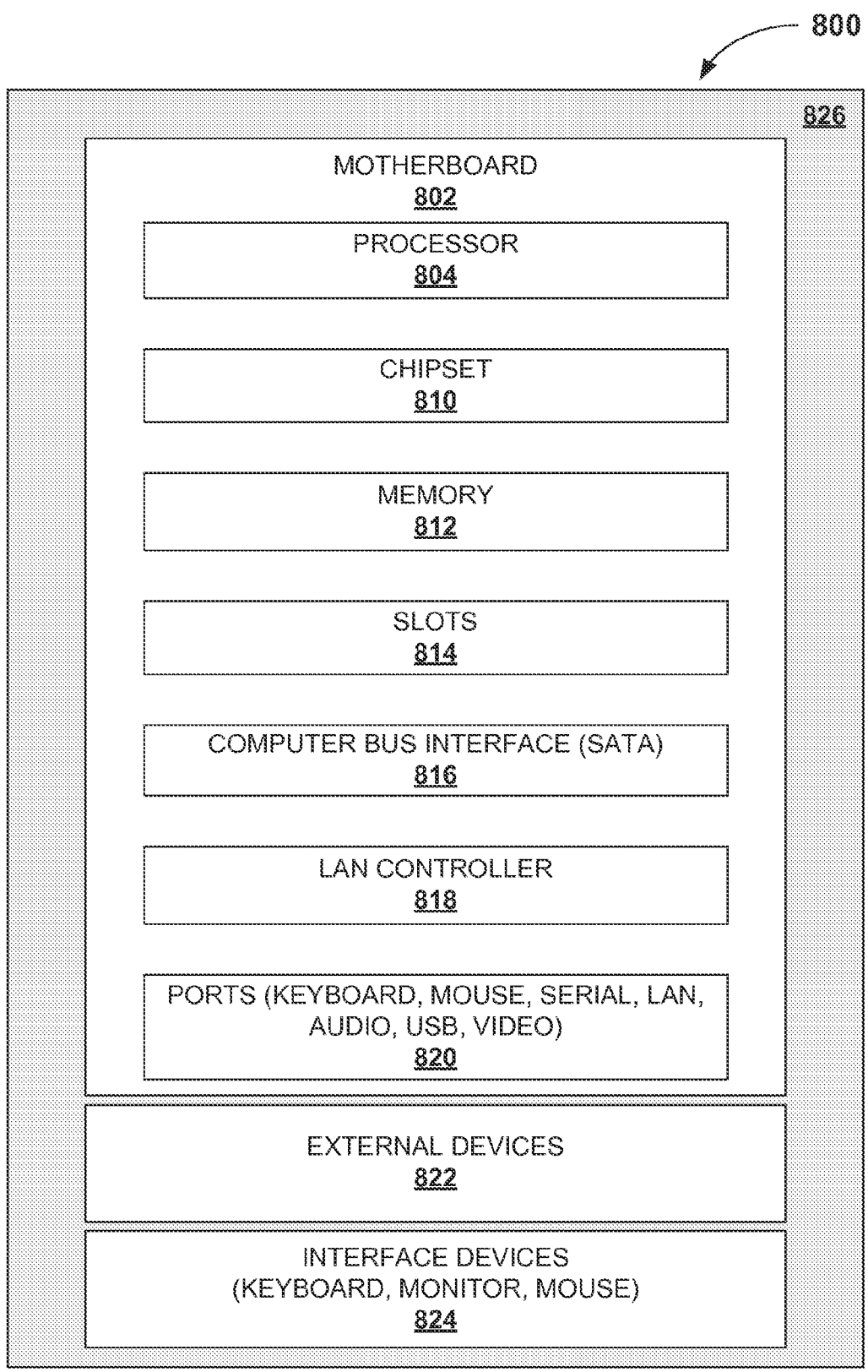
FIG. 8 schematically illustrates a computing device that includes a multilayer substrate for semiconductor packaging as described herein, in accordance with some embodiments.

Embodiments of the present disclosure may be implemented into a system using any suitable hardware and/or software to configure as desired. FIG. 8 schematically illustrates a computing device that includes a multilayer substrate for semiconductor packaging as described herein, in accordance with some embodiments. The embodiment of FIG. 8 may comport with embodiments of the substrate 100 of FIG. 1, the second layer 200 of FIG. 2, the substrate 300 of FIG. 3, the substrate 400 of FIG. 4, the method 500 of FIG. 5, the substrate of FIG. 6, and the package 700 of FIG. 7, with the addition of the multilayer substrate in a computing device. The substrate 100 of FIG. 1 may have a die coupled to the first side 102a in a flip chip configuration to provide a package 700 of FIG. 7. The die may be a processor or memory. The package with the processor or memory may be coupled to the motherboard 802 of FIG. 8.

The computing device 800 may house a board such as motherboard 802 (e.g., in housing 826). The motherboard 802 may include a number of components, including but not limited to a processor 804, chipset 810, memory 812, slots 814, computer bus interface 816, LAN controller 818, and ports 820. The chipset 810 may include a communications chip. The components may be physically and electrically coupled to the motherboard 802 and may include other components. The term "processor" may refer to any device or portion of a device that processes electronic data from registers and/or memory to transform that electronic data into other electronic data that may be stored in registers and/or memory.

Depending on applications, the computing device 800 may include external devices 822 and interface devices 824 that may or may not be physically and electrically coupled to the motherboard 802. These other components may include, but are not limited to, a liquid cooling system, interface devices (keyboard, display, mouse), memory, a graphics processor, a digital signal processor, a crypto processor, a chipset, an antenna, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In various implementations, the computing device 800 may be a computer system, a server, a rack server, a blade server, and a super computer system. In further implementations, the computing device 800 may be any other electronic device that processes data.

EXAMPLES

According to various embodiments, the present disclosure describes a multilayer substrate for semiconductor packaging. Example 1 of a multilayer substrate for semiconductor packaging (substrate) may include a first layer with a first side and a second side opposite the first side, wherein the first side has a first side xy-plane defined by three highest points on the first side, and individual locations on the first side have a first side distance below the first side xy-plane in a direction towards the second side, wherein the second side has a second side xy-plane defined by three highest points on the second side, and individual locations on the second side have a second side distance below the second side xy-plane in a direction towards the first side; and a second layer with a first side coupled to the second side of the first layer and a second side opposite the first side of the second layer, wherein a thickness of the second layer at the individual locations on the second layer is comprised of the first side distance plus the second side distance, wherein a thickness of the first layer plus the thickness of the second layer at individual locations between the first side of the first layer and the second side of the second layer is a substantially uniform thickness.

Example 2 may include the substrate of Example 1, wherein the first layer has electrical routing features to route electrical signals between the first side of the first layer and the second side of the first layer, wherein the second layer has electrical routing vias electrically coupled to the electrical routing features of the second side of the first layer and passing through the second layer from the first side of the second layer to the second side of the second layer, wherein the electrical routing vias have a depth corresponding to the thickness of the second layer.

Example 3 may include the substrate of Example 1, wherein the second layer is comprised of one or more layers of one or more dielectric materials.

Example 4 may include the substrate of Example 3, wherein the dielectric materials include a polymer or a polymer composite.

Example 5 may include the substrate of Example 4, wherein the dielectric materials are selected from the group consisting of Ajinomoto Build-up Film (ABF), fire retardant 2 material (FR2), fire retardant 4 material (FR4), polyimide, passivation film (WPR), poly benzthiazole (PBZT), poly benzoxazole (PBO), and mold compound, and combinations thereof.

Example 6 may include the substrate of Example 1, wherein the thickness of the second layer at the individual locations on the second layer is comprised of the first side distance plus the second side distance plus an offset distance, wherein the offset distance is less than approximately two times the sum of the first side distance and the second side distance.

Example 7 may include the substrate of Example 1, wherein the first layer is a multilayer composite substrate with a core.

Example 8 of a method of making a multilayer substrate for semiconductor packaging (method) may include providing a first layer with a first side and a second side opposite the first side, wherein the first layer is unconstrained, wherein the first side has a first side xy-plane defined by three highest points on the first side, and individual locations on the first side have a first side distance below the first side xy-plane in a direction towards the second side, wherein the second side has a second side xy-plane defined by three highest points on the second side, and individual locations on the second side have a second side distance below the second side xy-plane in a direction towards the first side; constraining the first layer by flattening the first side of the first layer against a surface of a rigid vacuum plate to provide a constrained first layer, wherein the second side of the first layer has a constrained second side distance that is the sum of the first side distance and the second side distance; and coupling a second layer to the constrained first layer, the second layer with a first side coupled to the second side of the first layer and with a second side opposite the first side of the second layer, wherein a thickness of the second layer at the individual locations on the second layer is comprised of the constrained second side distance, wherein a thickness of the first layer plus the thickness of the second layer at individual locations between the first side of the first layer and the second side of the second layer is a substantially uniform thickness.

Example 9 may include the method of Example 8, wherein the coupling of the second layer to the first layer further includes laminating, coating, or casting one or more layers of one or more dielectric materials.

Example 10 may include the method of Example 9, wherein the coupling of the second layer to the first layer comprises laminating, wherein the laminating further comprises sequentially attaching, conformally pressing, and plate pressing three build up layers.

Example 11 may include the method of Example 8 further including removing the rigid vacuum plate from the first side of the first layer to provide an unconstrained multilayer substrate.

Example 12 of a semiconductor package (package) may include a die; and a substrate with the die mounted in a flip chip configuration on the substrate, the substrate further including a first layer with a first side and a second side opposite the first side, the die coupled to the first side of the first layer, wherein before the die is coupled to the first side of the first layer, the first side has a first side xy-plane defined by three highest points on the first side, and individual locations on the first side have a first side distance below the first side xy-plane in a direction towards the second side, wherein before the die is coupled to the first side of the first layer, the second side has a second side xy-plane defined by three highest points on the second side, and individual locations on the second side have a second side distance below the second side xy-plane in a direction towards the first side; and a second layer with a first side coupled to the second side of the first layer and a second side opposite the first side of the second layer, wherein a thickness of the second layer at the individual locations on the second layer is comprised of the first side distance plus the second side distance, wherein a thickness of the first layer plus the thickness of the second layer at individual locations between the first side of the first layer and the second side of the second layer is a substantially uniform thickness.

Example 13 may include the package of Example 12, wherein the first layer has electrical routing features to route electrical signals between the first side of the first layer and the second side of the first layer, wherein the second layer has electrical routing vias electrically coupled to the electrical routing features of the second side of the first layer and passing through the second layer from the first side of the second layer to the second side of the second layer, wherein the electrical routing vias have a depth corresponding to the thickness of the second layer.

Example 14 may include the package of Example 12, wherein the second layer is comprised of one or more layers of one or more dielectric materials.

Example 15 may include the package of Example 14, wherein the dielectric materials include a polymer or a polymer composite.

Example 16 may include the package of Example 14, wherein the dielectric materials are selected from the group consisting of Ajinomoto Build-up Film (ABF), fire retardant 2 material (FR2), fire retardant 4 material (FR4), polyimide, passivation film (WPR), poly benzthiazole (PBZT), poly benzoxazole (PBO), and mold compound, and combinations thereof.

Example 17 may include the package of Example 12, wherein the thickness of the second layer at the individual locations on the second layer is comprised of the first side distance plus the second side distance plus an offset distance, wherein the offset distance is less than approximately two times the sum of the first side distance and the second side distance.

Example 18 may include the package of Example 12, wherein the first layer is a multilayer composite substrate with a core.

Example 19 of a computing device (device) may include a circuit board; and a semiconductor package mounted on the circuit board, the semiconductor package further including a die; and a substrate with the die mounted in a flip chip configuration on the substrate, the substrate further including a first layer with a first side and a second side opposite the first side, the die coupled to the first side of the first layer, wherein before the die is coupled to the first side of the first layer, the first side has a first side xy-plane defined by three highest points on the first side, and individual locations on the first side have a first side distance below the first side xy-plane in a direction towards the second side, wherein before the die is coupled to the first side of the first layer, the second side has a second side xy-plane defined by three highest points on the second side, and individual locations on the second side have a second side distance below the second side xy-plane in a direction towards the first side; and a second layer with a first side coupled to the second side of the first layer and a second side opposite the first side of the second layer, wherein a thickness of the second layer at the individual locations on the second layer is comprised of the first side distance plus the second side distance, wherein a thickness of the first layer plus the thickness of the second layer at individual locations between the first side of the first layer and the second side of the second layer is a substantially uniform thickness.

Example 20 may include the device of Example 19, wherein the first layer has electrical routing features to route electrical signals between the first side of the first layer and the second side of the first layer, wherein the second layer has electrical routing vias electrically coupled to the electrical routing features of the second side of the first layer and passing through the second layer from the first side of the second layer to the second side of the second layer, wherein the electrical routing vies have a depth corresponding to the thickness of the second layer.

Example 21 may include the device of Example 19, wherein the second layer is comprised of one or more layers of one or more dielectric materials.

Example 22 may include the device of Example 21, wherein the dielectric materials include a polymer or a polymer composite. Example 23 may include the device of Example 21, wherein the dielectric materials are selected from the group consisting of Ajinomoto Build-up Film (ABF), fire retardant 2 material (FR2), fire retardant 4 material (FR4), polyimide, passivation film (WPR), poly benzthiazole (PBZT), poly benzoxazole (PBC)), and mold compound, and combinations thereof.

Example 24 may include the device of Example 19, wherein the thickness of the second layer at the individual locations on the second layer is comprised of the first side distance plus the second side distance plus an offset distance, wherein the offset distance is less than approximately two times the sum of the first side distance and the second side distance.

Example 25 may include the device of Example 19, wherein the first layer is a multilayer composite substrate with a core.

Example 26 may include the device of Example 19, wherein the die is a processor.

Example 27 may include the device of any one of Examples 19-26, wherein the computing device is a motherboard, a board in a blade server, or a board in a rack server.

Example 28 may include the device of Example 19, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Example 29 may include the device of Example 19, where the circuit board is comprised of a flexible material.

What is claimed is:

1. A multilayer substrate for semiconductor packaging, comprising:
    a first layer with a first side and a second side opposite the first side, wherein the first side has a first side xy-plane defined by three highest points on the first side, and individual locations on the first side have a first side distance between the first side xy-plane and the first side below the first side xy-plane in a direction towards the second side, wherein the second side has a second side xy-plane defined by three highest points on the second side, and individual locations on the second side have a second side distance between the second side xy-plane and the second side below the second side xy-plane in a direction towards the first side; and
    a second layer comprised of one or more layers of one or more dielectric materials, the second layer with a first side coupled to the second side of the first layer and a second side opposite the first side of the second layer, wherein a thickness of the second layer at individual locations on the second layer is comprised of the first side distance plus the second side distance, wherein a thickness of the first layer plus the thickness of the second layer at individual locations between the first side of the first layer and the second side of the second layer is a substantially uniform thickness.

2. The substrate of claim 1, wherein the first layer has electrical routing features to route electrical signals between the first side of the first layer and the second side of the first layer, wherein the second layer has electrical routing vias electrically coupled to the electrical routing features of the second side of the first layer and passing through the second layer from the first side of the second layer to the second side of the second layer, wherein the electrical routing vias have a depth corresponding to the thickness of the second layer.

3. The substrate of claim 1, wherein the dielectric materials are selected from a group consisting of Ajinomoto Build-up Film (ABF), fire retardant 2 material (FR2), fire retardant 4 material (FR4), polyimide, passivation film (WPR), poly benzthiazole (PBZT), poly benzoxazole (PBO), and mold compound, and combinations thereof.

4. The substrate of claim 1, wherein the thickness of the second layer at the individual locations on the second layer is comprised of the first side distance plus the second side distance plus an offset distance, wherein the offset distance is less than approximately two times a sum of the first side distance and the second side distance.

5. The substrate of claim 1, wherein the first layer is a multilayer composite substrate with a core.

6. A method of making a multilayer substrate for semiconductor packaging, the method comprising:
    providing a first layer with a first side and a second side opposite the first side, wherein the first layer is unconstrained, wherein the first side has a first side xy-plane defined by three highest points on the first side, and individual locations on the first side have a first side distance between the first side xy-plane and the first side below the first side xy-plane in a direction towards the second side, wherein the second side has a second side xy-plane defined by three highest points on the second side, and individual locations on the second side have a second side distance between the second side xy-plane and the second side below the second side xy-plane in a direction towards the first side;
    constraining the first layer by flattening the first side of the first layer against a surface of a rigid vacuum plate to provide a constrained first layer, wherein the second side of the first layer has a constrained second side distance that is a sum of the first side distance and the second side distance; and
    coupling a second layer to the constrained first layer, the second layer comprised of one or more layers of one or more dielectric materials, the second layer with a first side coupled to the second side of the first layer and with a second side opposite the first side of the second layer, wherein a thickness of the second layer at individual locations on the second layer is comprised of the constrained second side distance, wherein a thickness of the first layer plus the thickness of the second layer at individual locations between the first side of the first layer and the second side of the second layer is a substantially uniform thickness.

7. The method of claim 6, wherein the coupling of the second layer to the first layer further comprises:
laminating, coating, or casting one or more layers of one or more dielectric materials.

8. The method of claim 7, wherein the coupling of the second layer to the first layer comprises laminating, wherein the laminating further comprises:
sequentially attaching, conformally pressing, and plate pressing three build-up layers.

9. The method of claim 6, further comprising:
removing the rigid vacuum plate from the first side of the first layer to provide an unconstrained multilayer substrate.

10. A semiconductor package, comprising:
a die; and
substrate with the die mounted in a flip chip configuration on the substrate, the substrate further comprising:
a first layer that is a multilayer composite substrate with a core, the first layer with a first side and a second side opposite the first side, the die coupled to the first side of the first layer,
wherein before the die is coupled to the first side of the first layer, the first side has a first side xy-plane defined by three highest points on the first side, and individual locations on the first side have a first side distance between the first side xy-plane and the first side below the first side xy-plane in a direction towards the second side,
wherein before the die is coupled to the first side of the first layer, the second side has a second side xy-plane defined by three highest points on the second side, and individual locations on the second side have a second side distance between the second side xy-plane and the second side below the second side xy-plane in a direction towards the first side; and
a second layer with a first side coupled to the second side of the first layer and a second side opposite the first side of the second layer,
wherein a thickness of the second layer at individual locations on the second layer is comprised of the first side distance plus the second side distance,
wherein a thickness of the first layer plus the thickness of the second layer at individual locations between the first side of the first layer and the second side of the second layer is a substantially uniform thickness.

11. The package of claim 10, wherein the first layer has electrical routing features to route electrical signals between the first side of the first layer and the second side of the first layer, wherein the second layer has electrical routing vias electrically coupled to the electrical routing features of the second side of the first layer and passing through the second layer from the first side of the second layer to the second side of the second layer, wherein the electrical routing vias have a depth corresponding to the thickness of the second layer.

12. The package of claim 10, wherein the second layer is comprised of one or more layers of one or more dielectric materials.

13. The package of claim 12, wherein the dielectric materials are selected from a group consisting of Ajinomoto Build-up Film (ABF), fire retardant 2 material (FR2), fire retardant 4 material (FR4), polyimide, passivation film (WPR), poly benzthiazole (PBZT), poly benzoxazole (PBO), and mold compound, and combinations thereof.

14. The package of claim 10, wherein the thickness of the second layer at the individual locations on the second layer is comprised of the first side distance plus the second side distance plus an offset distance, wherein the offset distance is less than approximately two times a sum of the first side distance and the second side distance.

15. A computing device, comprising:
a circuit board; and
a semiconductor package mounted on the circuit board, the semiconductor package further comprising:
a die; and
a substrate with the die mounted in a flip chip configuration on the substrate, the substrate further comprising
a first layer that is a multilayer composite substrate with a core, the first layer with a first side and a second side opposite the first side, the die coupled to the first side of the first layer,
wherein before the die is coupled to the first side of the first layer, the first side has a first side xy-plane defined by three highest points on the first side, and individual locations on the first side have a first side distance between the first side and the first side xy-plane below the first side xy-plane in a direction towards the second side, wherein before the die is coupled to the first side of the first layer, the second side has a second side xy-plane defined by three highest points on the second side, and individual locations on the second side have a second side distance between the second side and the second side xy-plane below the second side xy-plane in a direction towards the first side; and
a second layer with a first side coupled to the second side of the first layer and a second side opposite the first side of the second layer,
wherein a thickness of the second layer at individual locations on the second layer is comprised of the first side distance plus the second side distance,
wherein a thickness of the first layer plus the thickness of the second layer at individual locations between the first side of the first layer and the second side of the second layer is a substantially uniform thickness.

16. The computing device of claim 15, wherein the first layer has electrical routing features to route electrical signals between the first side of the first layer and the second side of the first layer, wherein the second layer has electrical routing vias electrically coupled to the electrical routing features of the second side of the first layer and passing through the second layer from the first side of the second layer to the second side of the second layer, wherein the electrical routing vias have a depth corresponding to the thickness of the second layer.

17. The computing device of claim 15, wherein the second layer is comprised of one or more layers of one or more dielectric materials.

18. The computing device of claim 17, wherein the dielectric materials are selected from a group consisting of Ajinomoto Build-up Film (ABF), fire retardant 2 material (FR2), fire retardant 4 material (FR4), polyimide, passivation film (WPR), poly benzthiazole (PBZT), poly benzoxazole (PBO), and mold compound, and combinations thereof.

19. The computing device of claim 15, wherein the thickness of the second layer at the individual locations on the second layer is comprised of the first side distance plus the second side distance plus an offset distance, wherein the offset distance is less than approximately two times the sum of the first side distance and the second side distance.

20. The computing device of claim 15, wherein the die is a processor.

21. The computing device of claim 15, wherein the computing device is a motherboard, a board in a blade server, or a board in a rack server.

22. The computing device of claim 15, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

23. The computing device of claim 15, where the circuit board is comprised of a flexible material.

* * * * *